(12) United States Patent
Yu et al.

(10) Patent No.: US 8,753,978 B2
(45) Date of Patent: Jun. 17, 2014

(54) METAL AND SILICON CONTAINING CAPPING LAYERS FOR INTERCONNECTS

(75) Inventors: Jengyi Yu, San Ramon, CA (US); Gengwei Jiang, Lake Oswego, OR (US); Pramod Subramonium, Beaverton, OR (US); Roey Shaviv, Palo Alto, CA (US); Hui-Jung Wu, Fremont, CA (US); Nagraj Shankar, Tualatin, OR (US)

(73) Assignee: Novellus Systems, Inc., Fremont, CA (US)

( * ) Notice: Subject to any disclaimer, the term of this patent is extended or adjusted under 35 U.S.C. 154(b) by 81 days.

(21) Appl. No.: 13/486,272

(22) Filed: Jun. 1, 2012

(65) Prior Publication Data

US 2013/0143401 A1    Jun. 6, 2013

Related U.S. Application Data

(60) Provisional application No. 61/492,951, filed on Jun. 3, 2011.

(51) Int. Cl.
*H01L 21/4763* (2006.01)

(52) U.S. Cl.
USPC .......................................................... 438/643

(58) Field of Classification Search
None
See application file for complete search history.

(56) References Cited

U.S. PATENT DOCUMENTS

| | | | |
|---|---|---|---|
| 4,282,268 A | 8/1981 | Priestley et al. | |
| 5,447,887 A * | 9/1995 | Filipiak et al. | 438/644 |
| 5,975,740 A | 11/1999 | Lin et al. | |
| 6,143,657 A | 11/2000 | Liu et al. | |
| 6,153,523 A | 11/2000 | Van Ngo et al. | |
| 6,181,013 B1 | 1/2001 | Liu et al. | |
| 6,271,595 B1 | 8/2001 | McGahay et al. | |
| 6,518,167 B1 | 2/2003 | You et al. | |
| 6,573,604 B1 | 6/2003 | Kajita | |
| 6,599,827 B1 * | 7/2003 | Ngo et al. | 438/627 |
| 6,750,541 B2 | 6/2004 | Ohtsuka et al. | |
| 6,777,323 B2 | 8/2004 | Kakamu | |
| 6,821,890 B2 * | 11/2004 | McGahay et al. | 438/687 |
| 6,844,258 B1 * | 1/2005 | Fair et al. | 438/648 |

(Continued)

FOREIGN PATENT DOCUMENTS

| | | |
|---|---|---|
| CN | 102130046 | 7/2011 |
| EP | 2259303 | 12/2010 |

(Continued)

OTHER PUBLICATIONS

U.S. Appl. No. 11/710,652, filed Feb. 22, 2007, Entitled: "Improved Diffusion Bather and Etch Stop Films".

(Continued)

*Primary Examiner* — Scott B Geyer
(74) *Attorney, Agent, or Firm* — Weaver Austin Villeneuve & Sampson LLP

(57) ABSTRACT

Disclosed methods cap exposed surfaces of copper lines with a layer of metal or metal-containing compound combined with silicon. In some cases, the metal or metal-containing compound forms an atomic layer. In certain embodiments, the methods involve exposing the copper surface first to a metal containing precursor to form an atomic layer of adsorbed precursor or metal atoms, which may optionally be converted to an oxide, nitride, carbide, or the like by, e.g., a pinning treatment. Subsequent exposure to a silicon-containing precursor may proceed with or without metallic atoms being converted.

21 Claims, 3 Drawing Sheets

(56) References Cited

U.S. PATENT DOCUMENTS

| | | | |
|---|---|---|---|
| 6,855,645 | B2 | 2/2005 | Tang et al. |
| 6,869,873 | B2 | 3/2005 | Bradshaw et al. |
| 6,974,768 | B1 | 12/2005 | Kailasam |
| 7,060,619 | B2 | 6/2006 | Cowley et al. |
| 7,202,185 | B1 | 4/2007 | Hausmann et al. |
| 7,211,509 | B1 | 5/2007 | Gopinath et al. |
| 7,239,017 | B1 | 7/2007 | Yu et al. |
| 7,247,946 | B2 * | 7/2007 | Bruley et al. ............... 257/751 |
| 7,250,679 | B2 | 7/2007 | Otsuka |
| 7,282,438 | B1 | 10/2007 | Yu et al. |
| 7,297,608 | B1 | 11/2007 | Papasouliotis et al. |
| 7,396,759 | B1 * | 7/2008 | van Schravendijk et al. . 438/625 |
| 7,402,532 | B2 | 7/2008 | Clevenger et al. |
| 7,420,275 | B1 | 9/2008 | Yu et al. |
| 7,452,743 | B2 | 11/2008 | Oliver et al. |
| 7,576,006 | B1 | 8/2009 | Yu et al. |
| 7,601,636 | B2 * | 10/2009 | Dumas et al. ............... 438/643 |
| 7,648,899 | B1 | 1/2010 | Banerji et al. |
| 7,704,873 | B1 | 4/2010 | Yu et al. |
| 7,727,880 | B1 | 6/2010 | Chattopadhyay et al. |
| 7,727,881 | B1 | 6/2010 | Chattopadhyay et al. |
| 7,799,671 | B1 | 9/2010 | Banerji et al. |
| 7,858,510 | B1 * | 12/2010 | Banerji et al. ............... 438/598 |
| 8,021,486 | B1 | 9/2011 | Yu et al. |
| 8,030,777 | B1 | 10/2011 | Van Schravendijk et al. |
| 8,268,722 | B2 | 9/2012 | Yu et al. |
| 8,317,923 | B1 | 11/2012 | Chattopadhyay et al. |
| 8,349,730 | B2 * | 1/2013 | Shih et al. ............... 438/652 |
| 8,430,992 | B1 | 4/2013 | Chattopadhyay et al. |
| 2001/0006701 | A1 | 7/2001 | Kobayashi et al. |
| 2002/0066411 | A1 | 6/2002 | Chiang et al. |
| 2002/0074664 | A1 * | 6/2002 | Nogami et al. ............... 257/764 |
| 2002/0155702 | A1 | 10/2002 | Aoki et al. |
| 2002/0173158 | A1 | 11/2002 | Jeng |
| 2002/0192396 | A1 * | 12/2002 | Wang et al. ............... 427/574 |
| 2003/0209738 | A1 | 11/2003 | Ohto et al. |
| 2003/0224599 | A1 * | 12/2003 | Zistl et al. ............... 438/678 |
| 2004/0092096 | A1 | 5/2004 | Raaijmakers et al. |
| 2004/0097075 | A1 | 5/2004 | Bradshaw et al. |
| 2004/0130030 | A1 * | 7/2004 | Kunimune et al. ........... 257/758 |
| 2004/0175921 | A1 | 9/2004 | Cowley et al. |
| 2004/0238963 | A1 | 12/2004 | Fujisawa |
| 2004/0266171 | A1 * | 12/2004 | Aoki et al. ............... 438/622 |
| 2005/0048767 | A1 | 3/2005 | Matsumoto |
| 2005/0127511 | A1 | 6/2005 | Yang et al. |
| 2005/0142833 | A1 | 6/2005 | Kim |
| 2005/0282378 | A1 | 12/2005 | Fukunaga et al. |
| 2006/0046479 | A1 | 3/2006 | Rajagopalan et al. |
| 2006/0166448 | A1 | 7/2006 | Cohen |
| 2006/0286764 | A1 | 12/2006 | Zhang et al. |
| 2007/0035029 | A1 | 2/2007 | Caubet et al. |
| 2007/0037388 | A1 | 2/2007 | Hohage et al. |
| 2007/0059925 | A1 | 3/2007 | Choi et al. |
| 2007/0105377 | A1 | 5/2007 | Koos et al. |
| 2007/0123044 | A1 * | 5/2007 | Hohage et al. ............... 438/687 |
| 2007/0145600 | A1 | 6/2007 | Yano et al. |
| 2008/0150137 | A1 * | 6/2008 | Liu et al. ............... 257/751 |
| 2008/0233745 | A1 | 9/2008 | Chang et al. |
| 2009/0280643 | A1 * | 11/2009 | Andry et al. ............... 438/656 |
| 2010/0308463 | A1 | 12/2010 | Yu et al. |

FOREIGN PATENT DOCUMENTS

| | | |
|---|---|---|
| JP | 56157037 | 12/1981 |
| JP | 09082696 A | 3/1997 |
| JP | 2000-252278 | 9/2000 |
| TW | 201117321 | 5/2011 |
| TW | 201138024 | 11/2011 |
| WO | WO 2012/167141 | 12/2012 |

OTHER PUBLICATIONS

Office Action dated Jun. 13, 2007, Novellus Systems, Inc., van Schravendijk et al., "Protection of CU Damascene Interconnects by Formation of a Self-Aligned Buffer Layer" U.S. Appl. No. 10/980,076, filed Nov. 3, 2004.

Renesas Technology Corp., Japan, "Reliability Improvement and its Mechanism for Cu Interconnects with Cu-Al Alloy Seeds", pp. 77 & 78 (ADMETA 2006).

IEEE 07CH37867 45th Annual International Reliability Physics Symposium, Phoenix, 2007, NEC Electronics Corporation, Japan "Analytical Study of Impurity Doping Effects on Electromigration of Cu Interconnects by Employing Comprehensive Scattering Model", pp. 117-121.

IEEE © 2004, Taiwan Semiconductor Manufacturing Company, Ltd., "High Performanc Cu interconnects capped with Full-Coverage ALD TaNx layer for Cu/Low-k (k~2.5) Metallization", pp. 72-74.

IEEE © 2005, NEC Corporation and NEC Electronics, Japan, A Robust 45 nm-node, Dual Damascene Interconnects with High Quality Cu/bather Interface by a Novel Oxygen Absorption Process (4) four pages.

Quirk, "Semiconductor manufacturing technology", 2001, Prentice Hall, pp. 522-527.

U.S. Office Action, mailed Nov. 28, 2007, for U.S. Appl. No. 10/980,076.

U.S. Office Action, mailed Aug. 21, 2008 for U.S. Appl. No. 11/888,323.

U.S. Office Action, mailed Apr. 2, 2009 for U.S. Appl. No. 12/074,108.

Notice of Allowance and Fee Due mailed Jun. 17, 2009 for U.S. Appl. No. 11/888,323 and Allowed Claims.

U.S. Office Action mailed Sep. 1, 2009 for U.S. Appl. No. 11/709,293.

U.S. Office Action mailed Sep. 4, 2009 for U.S. Appl. No. 11/709,294.

U.S. Notice of Allowance and Fee Due, mailed Sep. 4, 2009, for U.S. Appl. No. 12/074,108 and Allowed Claims.

U.S. Notice of Allowance and Allowed Claims mailed Jan. 29, 2010 for U.S. Appl. No. 11/709,293.

U.S. Notice of Allowance and Allowed Claims mailed Feb. 22, 2010 for U.S. Appl. No. 11/709,294.

Novellus Systems, Inc., Chattopadhyay et al., "Protective Self-Aligned Buffer Layers for Damascene Interconnects", U.S. Appl. No. 12/762,223, filed Apr. 16, 2010.

Novellus Systems, Inc., Chattopadhyay et al., "Protective Self-Aligned Buffer Layers for Damascene Interconnects", U.S. Appl. No. 12/763,545, filed Apr. 20, 2010.

Novellus Systems, Inc., Yu et al., "Protective Self-Aligned Buffer Layers for Damascene Interconnects", U.S. Appl. No. 12/693,645, filed Jan. 26, 2010.

U.S. Notice of Allowance and Allowed Claims, mailed Jun. 28, 2010, for U.S. Appl. No. 12/630,457.

U.S. Notice of Allowance and Allowed Claims for U.S. Appl. No. 12/689,803 mailed Aug. 12, 2010.

U.S. Office Action for U.S. Appl. No. 12/693,645 mailed Dec. 3, 2010.

Novellus Systems, Inc., van Schravendijk et al., "Protection of CU Damascene Interconnects by Formation of Self-Aligned Buffer Layer", U.S. Appl. No. 11/671,161, filed Feb. 5, 2007.

U.S. Office Action for U.S. Appl. No. 11/671,161 mailed Dec. 12, 2008.

U.S. Final Office Action for U.S. Appl. No. 11/671,161 mailed Jun. 17, 2009.

U.S. Office Action for U.S. Appl. No. 11/671,161 mailed Oct. 29, 2009.

U.S. Final Office Action for U.S. Appl. No. 11/671,161 mailed Feb. 19, 2010.

U.S. Office Action for U.S. Appl. No. 11/671,161 mailed Aug. 17, 2010.

U.S. Final Office Action for U.S. Appl. No. 11/671,161 mailed Dec. 6, 2010.

U.S. Notice of Allowance and Allowed Claims for U.S. Appl. No. 12/693,645, mailed May 18, 2011.

U.S. Office Action mailed Aug. 9, 2011 for U.S. Appl. No. 12/467,200.

(56) References Cited

OTHER PUBLICATIONS

U.S. Office Action mailed Feb. 8, 2012 for U.S. Appl. No. 12/688,154.
U.S. Notice of Allowance and Allowed Claims for U.S. Appl. No. 12/693,645, mailed May 29, 2012.
Office Action dated Mar. 15, 2012 issued in U.S. Appl. No. 12/762,223.
Chattopadhyay et al., U.S. Appl. No. 13/482,786, filed May 29, 2012, entitled "Selective Capping of Metal Interconnect Lines During air Gap Formation".
US Office Action, dated Jun. 28, 2012, issued in U.S. Appl. No. 12/763,545.
US Notice of Allowance, dated Jan. 3, 2013, issued in U.S. Appl. No. 12/763,545.
US Notice of Allowance, dated Aug. 3, 2012, issued in U.S. Appl. No. 12/762,223.
US Notice of Allowance, dated Dec. 15, 2009, issued in U.S. Appl. No. 11/726,363.
US Notice of Allowance, dated Mar. 11, 2008, issued in U.S. Appl. No. 10/980,076.
US Notice of Allowance, dated May 31, 2011, issued in U.S. Appl. No. 11/671,161.
European Extended Search Report, dated Oct. 29, 2012, issued in EP10 164 594.3.
PCT International Search Report and Written Opinion, dated Dec. 26, 2012, issued in PCT/US2012/040542.
Ueno et al. (Jun. 6-8, 1995) "A Half-Micron Pitch Cu Interconnection Technology," *Symposium on VLSI Technology, Digest of Technical Papers*, (IEEE Cat. No. 95CH35781) *Japan Soc. Appl. Phys.* Tokyo, Japan, pp. 27-28 XP002685158.
Chinese Office Action dated Feb. 8, 2014, issued in Application No. 201110021170.4.

\* cited by examiner

METAL AND SILICON CONTAINING CAPPING LAYERS FOR INTERCONNECTS

CROSS-REFERENCE TO RELATED APPLICATIONS

This application claims benefit of U.S. Provisional Patent Application No. 61/492,951, filed Jun. 3, 2011, which is incorporated herein by reference in its entirety and for all purposes.

BACKGROUND

Damascene processing is a method for forming metal lines on integrated circuits. It involves formation of inlaid metal lines in trenches and vias formed in a dielectric layer (inter layer dielectric or ILD). Damascene processing is particularly well-suited to metals such as copper that cannot be readily patterned by plasma etching.

In a typical Damascene process flow, copper or other metal is deposited onto a patterned dielectric to fill the vias and trenches formed in the dielectric layer. A thin layer of a dielectric diffusion barrier material, such as silicon carbide or silicon nitride, is deposited between adjacent metallization layers to prevent diffusion of metal into bulk layers of dielectric. In some cases, the silicon carbide or silicon nitride dielectric diffusion barrier layer also serves as an etch stop layer during patterning of the inter layer dielectric layer.

In a typical integrated circuit (IC), several metallization layers are deposited on top of each other forming a stack, where metal-filled vias and trenches serve as IC conducting paths. The conducting paths of one metallization layer are connected to the conducting paths of an underlying or overlying layer by a series of Damascene interconnects.

Fabrication of these interconnects presents several challenges, which become more and more significant as the dimensions of IC device features continue to shrink. There is a strong need for interconnect fabrication methods that can provide interconnects with improved lifetime and reliability.

SUMMARY

Disclosed methods cap exposed surfaces of copper lines with a layer of metal or metal-containing compound combined with silicon. In some cases, the metal or metal-containing compound forms an atomic layer. In certain embodiments, the methods involve exposing the Cu surface first to a metal containing precursor to form an atomic layer of adsorbed precursor or metal atoms, which may optionally be converted to a dielectric compound (oxide, nitride, carbide, or mixtures thereof) by, e.g., a pinning treatment. Subsequent exposure to silane or other silicon-containing precursor may proceed with or without metallic atoms being converted. The metal and silicon combination process improves adhesion of a subsequently deposited barrier layer to copper.

One aspect of the disclosure pertains to methods of forming a capping layer on a current carrying metal line of a semiconductor device. In certain embodiments, such method is characterized by the following operations: (a) delivering a metal-containing precursor to a reaction chamber holding a partially fabricated semiconductor device having an exposed surface of a metal line; (b) delivering a silicon-containing precursor to the reaction chamber; and (c) forming the capping layer on the metal line by allowing at least a portion of the silicon-containing precursor to interact with the exposed surface of the metal line and/or interact with the metal-containing precursor or a first metal. In some implementations, operations (b) and (c) overlap in time. Operation (a) may result in the metal-containing precursor adhering or bonding to the exposed surface of the metal line. The metal-containing precursor contains a first metal. Typically, though not necessarily, the first metal of the metal-containing precursor is different from the metal of the metal line. As examples, the first metal may be aluminum, titanium, magnesium, or calcium.

In certain embodiments, the method also includes an operation of cleaning the exposed surface of the metal line prior to performing operation (a). In some embodiments, the method also includes an operation of removing an oxide from the exposed surface of the metal line prior to performing operation (a).

In certain embodiments, operation (a) comprises a chemical vapor deposition reaction. In some cases, operation (a) results in the first metal depositing on the exposed surface of the metal line. In other cases, the metal-containing precursor or a modified version of it adheres to or bonds with the exposed metal surface.

In certain embodiments, the metal-containing precursor an organoaluminum compound, an organomagnesium compound, an organotitanium compound, or an organocalcium compound. In certain embodiments, the silicon-containing precursor is a silane or a substituted silane. In various implementations, the silicon containing precursor attaches to the exposed surface of the metal line in interstitial regions where the metal-containing precursor did not adhere or bond to the metal line.

In some embodiments, the method includes an operation of converting at least some of the metal-containing precursor or the first metal on the exposed surface of the metal line to a dielectric material. As examples, the dielectric material contains the first metal and oxygen, carbon, or nitrogen. Typically, though not necessarily, the operation of converting at least some of the layer of the first metal to a dielectric material is performed prior to operation (c). In alternative embodiments, the metal-containing precursor is not converted to a dielectric material prior to performing operation (c). In some implementations, operation (c) is performed in the presence of a plasma.

The metal line may be an interconnect line. It may be part of a device fabricated in dimensions associated with the 45 nanometer technology node or the 22 nanometer technology node, or a more advanced technology node. The above method may additionally include an operation of forming a diffusion barrier over the capping layer. In some cases, the diffusion barrier is a silicon carbide.

Another aspect of the disclosure concerns apparatus for forming a capping layer on a current carrying metal line of a semiconductor device. In certain embodiments, the apparatus includes the following elements: a reaction chamber containing a wafer holding element for holding a wafer during processing; one or more inlets to the reaction chamber for delivering a metal-containing precursor and a silicon-containing precursor; and a controller comprising instructions for performing operations such as those associated with the methods disclosed herein. In some cases, the controller is designed or configured to cause the apparatus to perform the following operations: (i) delivering a metal-containing precursor to the reaction chamber under conditions in which the metal-containing precursor adheres or bonds to an exposed surface of the metal line on the wafer; (ii) delivering a silicon-containing precursor to the reaction chamber; and (iii) forming the capping layer on the metal line by allowing at least a portion of the silicon-containing precursor to interact with the exposed surface as modified by the metal-containing precursor.

In certain embodiments, the apparatus additionally includes a plasma generator. In some such embodiments, the controller includes instructions for generating a plasma in the reaction chamber while forming the capping layer. In some embodiments, the controller includes instructions for pre-cleaning the wafer prior to operation (i).

In some embodiments, the reaction chamber includes multiple stations. In such cases, the controller may include additional instructions for holding the wafer in a first station during operation (i), moving the wafer to a second station, and holding the wafer in the second station during operation (ii).

In some implementations, the controller includes additional instructions for converting at least some of the metal-containing precursor, or a metal derived therefrom, on the exposed surface of the metal line to a dielectric material.

These and other features will be described in more detail below with reference to the associated drawings.

DESCRIPTION

Introduction and Context

Figure 1:
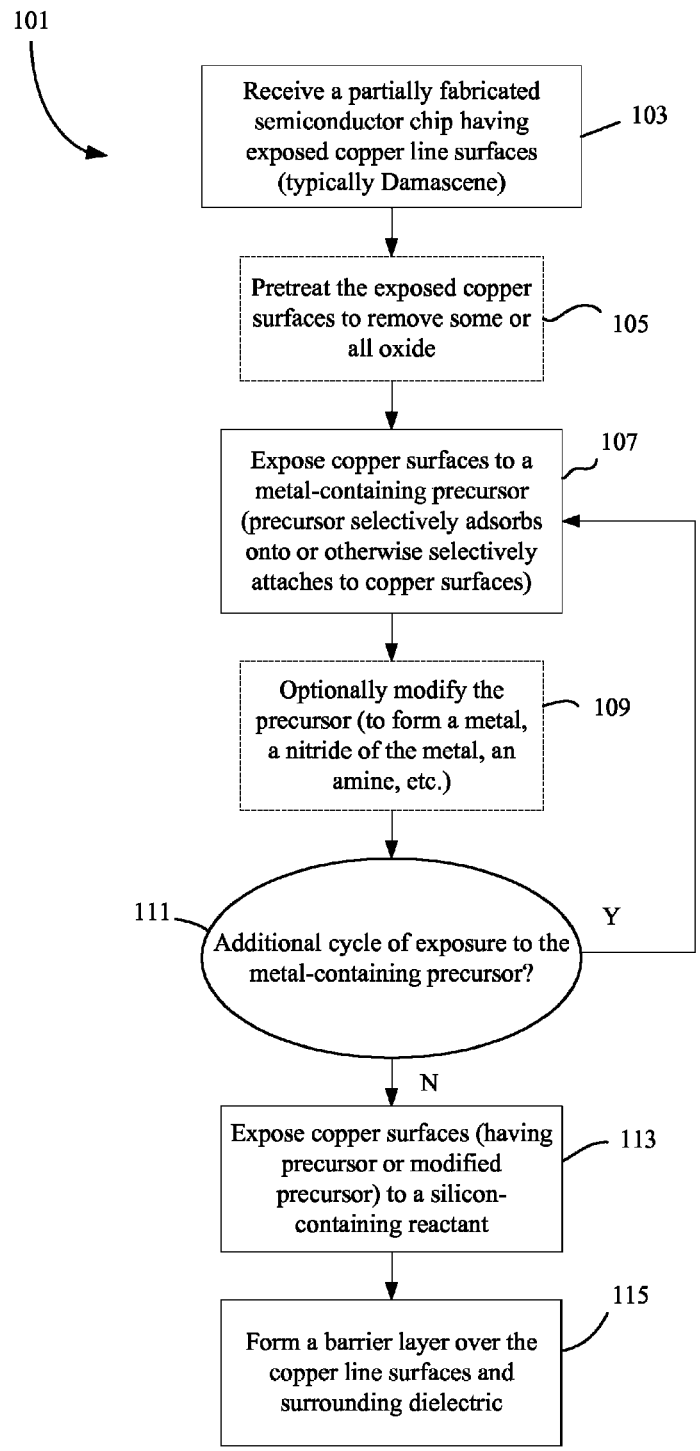
FIG. 1 is a flow chart representing certain embodiments of this disclosure.

One challenging problem encountered during IC fabrication is electromigration failure. Electromigration occurs when high current densities experienced by an interconnect lead to migration of metal atoms with the current, and, consequently, lead to formation of voids within interconnects. Ultimately, formation of such voids may lead to failure of the device. During ongoing miniaturization of IC devices, interconnect dimensions are decreasing, and larger current densities are experienced by interconnects. As a consequence, the probability of electromigration failure increases with miniaturization. While copper has a greater electromigration resistance than aluminum, even in copper interconnects, electromigration failure becomes a significant reliability problem at the 45 nm technology node, the 22 nm technology node and beyond.

Electromigration failure has been attributed to the following causes. First, the copper surface can be oxidized easily upon exposure to air or trace amounts of oxygen to form copper oxide. Unfortunately, copper oxide has a relatively weak bond energy (<200 kJ/mol) and is therefore easily compromised when exposed to electronic current. By comparison other oxides such as $SiO_2$, $Al_2O_3$, and $TiO_2$ have higher bond energies (>300 kJ/mol). Further, there is poor interfacial bonding energy and therefore poor adhesion between dielectric copper diffusion barrier layer (e.g., SiN, SiC, or SiCN) and the copper in a current carrying line. Poor adhesion has been attributed to the presence of surface copper oxide and/or the weak cohesive strength between dielectric diffusion barrier materials (e.g., SiN, SiC, or SiCN) and copper as compared to copper-metal interactions.

Adhesion layers residing at an interface between metal (e.g., copper) lines and dielectric diffusion barrier (or etch stop) layers that are capable of improving electromigration performance of interconnects are herein provided. Methods for forming such caps are also described. Advantageously, the described adhesion layers can be formed as very thin layers residing on the upper portion of a metal line at its interface with the dielectric diffusion barrier layer, without significantly increasing interconnect resistance. In some embodiments, no substantial diffusion of capping material into the metal line occurs, and the adhesion layer is cleanly segregated at the very top of the line, e.g., on or within the top portion of the line.

Formation of adhesion layers on interconnect surfaces may accomplished in the context of copper dual Damascene processing and in other processing methods, including single Damascene processing, and can be applied to a variety of interconnect metals beyond copper. For example, these methods can be applied to aluminum, gold, and silver-containing interconnects.

Other available techniques for protecting copper interconnects include the following, each of which may be used in conjunction with the adhesion layer embodiments disclosed herein.

1. Dopant Diffusion

The presence of alloying elements (foreign metallic atoms) in copper can improve EM performance due to interactions of the dopant and copper in the lattice. This approach, in some embodiments, is implemented by using a Cu—Al alloy seed layer for Cu electroplating. In this approach, after the vias and trenches have been formed in the dielectric layer, and after they have been conformally lined with a partially conductive diffusion barrier material (which may include Ta, Ti, W and nitrides thereof), a seed layer material containing both copper and aluminum is conformally deposited typically by PVD. The vias and trenches are then filled with copper typically by electroplating, and aluminum is allowed to diffuse into copper-filled lines typically after a thermal anneal. In other embodiments, after the copper lines have been filled with copper, a layer of aluminum is deposited on copper surface (e.g., by PVD or CVD) and thermal anneal is conducted to allow aluminum diffuse into copper.

2. Self-Aligned Barrier (SAB)

A capping layer on copper surface can also improve copper electromigration resistance. This approach is achieved in some embodiments using metallic alloy cap deposition, e.g., CoWP cap deposition. In this approach, a CoWP layer is selectively electrolessly deposited on copper surface without depositing on adjacent dielectric. Such caps can significantly improve electromigration performance of copper interconnects. However, a potential drawback of this kind of metallic barriers is that their deposition selectivity is typically poor on IMD dielectric surface. Therefore, metallic elements deposited between copper lines can cause leakage current and result in poor TDDB (Time Dependent Dielectric Breakdown).

In other embodiments PECVD self-aligned barriers are used, in which CuSiN barrier layers are formed within copper lines using PECVD. This method alleviates the potentially poor selectivity issues of CoWP capping mentioned above. In this method, the copper surface is pre-cleaned to remove copper oxide, and silane is contacted with the substrate in an absence of plasma to selectively form copper silicide at the upper surface of the interconnect line without reacting with the dielectric. "Nitrogen pinning" is then effected by applying an $NH_3$ anneal/plasma to form a CuSiN barrier. In other words, the CuSiN barrier is formed by modifying the surface of the copper interconnect, rather than by a deposition technique. This technique has a trade-off between electromigration improvement and conductive line resistance increase. Examples of PECVD self-aligned barriers are described in U.S. Pat. No. 7,704,873, filed Mar. 20, 2007, and U.S. patent application Ser. No. 12/688,154, filed Jan. 15, 2010, each incorporated herein by reference in its entirety.

Process Implementations

The disclosed methods cap exposed surfaces of copper lines with a layer of metal or metal-containing compound combined with silicon. In some cases, the metal or metal-containing compound forms an atomic layer. Additionally, the silicon may form a material characterized as CuSiHx. In certain embodiments, the methods involve exposing the Cu surface first to a metal containing precursor to form an atomic layer of adsorbed precursor or metal atoms, which may optionally be converted to a dielectric compound (oxide, nitride, carbide, or mixtures thereof) by, e.g., a pinning treatment. Subsequent exposure to silane or other silicon-containing precursor may proceed with or without metallic atoms being converted. The metal and silicon combination process may improve adhesion of a subsequently deposited barrier layer to copper in comparison to processes in which the adhesion results from applying a metal compound or silane alone. The combination capping sequence may also limit the resistance shift in the copper lines (e.g., to less than about 1%). Additionally resistance to electromigration may be significantly improved.

FIG. 1 presents a process flow 101 in which a partially fabricated semiconductor device is treated to improve electromigration resistance of current carrying lines. In the example of FIG. 1, the partially fabricated device has exposed copper damascene lines. See block 103.

As referenced in FIG. 1, a typical process initially involves pretreating a partially fabricated substrate containing the exposed copper lines in order to remove all or nearly all copper oxide formed on the exposed lines. See block 105. There may be other contaminants or debris on the copper lines that are also removed during the pretreatment step. Various pretreatment techniques may be employed including exposure to reducing plasmas and/or ultraviolet radiation. See U.S. patent application Ser. No. 12/688,154, filed Jan. 15, 2010 (incorporated herein by reference in its entirety), for additional details on the pretreatment and the resulting surface condition of the copper lines.

Note that in certain embodiments, it may be desirable to leave a small amount of residual copper oxide present on the copper lines prior to deposition of the metal and silicon-containing components described hereinafter. In certain embodiments, the removal of copper oxide is not performed.

After the copper lines are pretreated as appropriate, the substrate surface is exposed to a metal-containing precursor. See block 107 of FIG. 1. This results in chemical and/or physical absorption of the precursor onto the exposed surfaces of the copper lines. In one implementation, the adsorbed precursor is exposed to a silicon-containing precursor without further chemical conversion. In other options, the metal-containing precursor is first converted. See block 109. Various conversion processes are described in U.S. patent application Ser. No. 12/688,154, previously incorporated by reference. Any of these conversion processes are suitable for use with the method described herein. As an example, the precursor may be exposed to ammonia or other nitrogen containing reactant to form a metal nitride or metal amine on the copper line surfaces.

Figure 2:
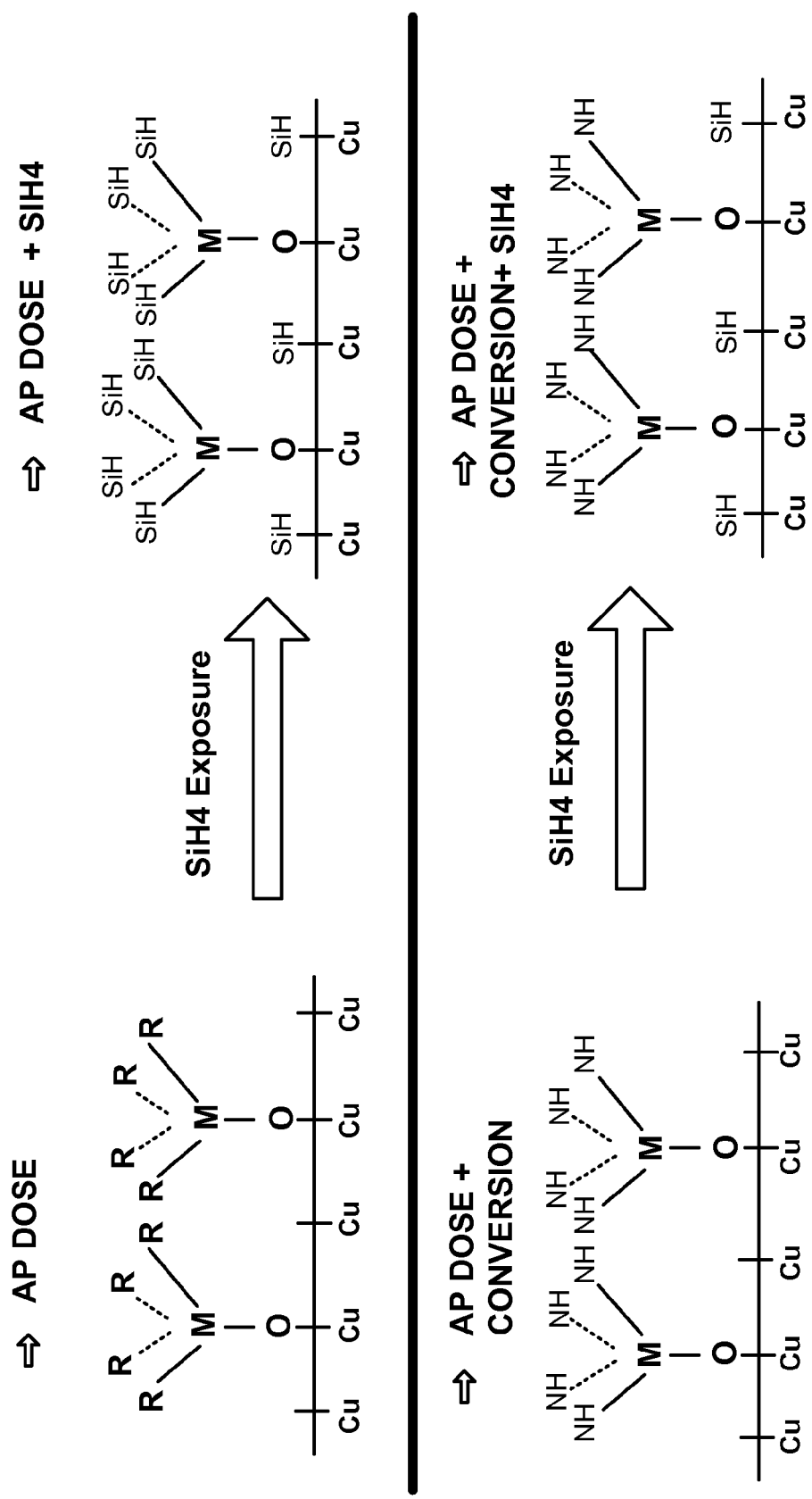
FIG. 2 shows two capping sequence mechanisms, one with and the other without absorbed metallic precursor being converted to a dielectric compound.

In some embodiments, the precursor attaches to the exposed copper surface through oxygen atoms that remain on the surface after the pretreatment (or alternatively are purposely introduced to modify the copper surface prior to exposure to the metal precursor). Linkage through oxygen atoms is depicted in FIG. 2 (discussed below).

A wide range of suitable metal-containing precursors are described in U.S. patent application Ser. No. 12/688,154, again incorporated by reference. Additionally, a range of conditions for adsorbing or otherwise attaching the metal precursor to the exposed copper line surfaces are described in U.S. patent application Ser. No. 12/688,154, again incorporated by reference. The application also includes descriptions of suitable deposition apparatus, and is incorporated by reference for its description of such apparatus.

In certain embodiments, one or more additional cycles of metal precursor deposition are performed. Any one or more of these additional cycles may be coupled with a chemical conversion step as described above. In certain embodiments, between 1 and about 10 (or between 1 and about 6) additional cycles of metal precursor deposition are performed. Any one, two or more of these cycles is coupled with chemical conversion. In certain embodiments, all additional cycles are coupled with the conversion step. These additional cycles are illustrated in FIG. 1 by operations 111, 107, and 109.

After the metal precursor is attached to the exposed copper surfaces—and optionally converted to a nitride or other metal containing material—the substrate is exposed to silane or other silicon-containing precursor. See block 113 of FIG. 1. This exposure to a silicon-containing precursor has been found to significantly improve the adhesion of the subsequently-deposited barrier or etch stop layer to the copper lines. Data depicting this is shown in Table 1 (adhesion energy).

The depicted process in FIG. 1 concludes with formation of a barrier layer over the substrate surface containing the metal and silicon-containing adhesion promoting layer. The resulting interface between the adhesion promoting layer and the barrier layer resists delamination and electromigration damage.

In certain embodiments, it is desirable that the silane or other silicon-containing precursor be delivered to the substrate under conditions that inhibit diffusion of silicon into the copper, which will result in a negative impact on the resistance of the current carrying lines. In this regard, it has been found that delivering silane in conjunction with ammonia results in relatively little diffusion of silicon into the copper. Further, adsorbed metal precursor may also react with silicon to prevent silicon diffusion into copper. On the other hand, delivery of silane together with hydrogen may not have this beneficial effect. Thus, in certain embodiments, the silicon containing precursor is delivered to the substrate surface in the absence of hydrogen (or with substantially no hydrogen present). In certain embodiments, the silicon-containing precursor is delivered with ammonia or other nitrogen containing compound.

In one embodiment, the silane or other silicon-containing precursor is delivered to the substrate at a substrate temperature of about 400° C. or lower or about 300° C. or lower. In a specific embodiment, the temperature is about 280° C. In a further embodiment, the volume ratio of ammonia to silane is about 5:1 to about 700:1. In some cases, the ratio may be between about 12:1 and about 100:1. In some examples, silane is delivered at a rate of about 120 sccm and the ammonia is delivered at a rate of about 7000 sccm.

Further examples and suitable options for delivering silane or other silicon-containing precursor are presented in U.S. patent application Ser. No. 11/726,363, filed Mar. 20, 2007, now U.S. Pat. No. 7,704,873, issued Apr. 27, 2010, which is incorporated herein by reference in its entirety. The application also includes descriptions of suitable deposition apparatus. See also, U.S. patent application Ser. No. 11/709,293, titled "Protective Self-aligned Buffer Layers for Damascene Interconnects" filed Feb. 20, 2007, naming Chattopadhyay et al. as inventors, and U.S. patent application Ser. No. 10/980,076 filed Nov. 3, 2004, titled "Protection of Cu Damascene Interconnects by Formation of a Self-aligned Buffer Layer," naming van Schravendijk et al. as inventors, all are incorporated herein by reference in their entireties and for disclosure process operations and sub-structures common to the invention disclosed herein.

It is been found that in some embodiments about 4 to 5 times more silane is required when treating substrates in which the metal containing precursor has not been converted than in cases where the metal containing precursor has been converted. For example, using the above silane dosing conditions, a silane ammonia mixture may need to be exposed to a substrate with unconverted metal for about 14 seconds, while the same mixture needs to be exposed to the surface for only 3 seconds when the metal containing precursor has been previously converted.

It is believed that exposure to a metal or metal-containing precursor improves the barrier layer to Cu adhesion. But due to the steric hindrance of the compound, the concentration of metal atoms bonded to Cu surface is limited. In other words, various sites on the exposed copper surface are not available for attachment of the metal or metal compound. In the interstitial area, bare Cu surface is not "pinned" by metal atoms. In described embodiments employing subsequent $SiH_4$ exposure, the small $SiH_4$ molecule can reach the interstitial area and form a copper-silicon material (e.g., $CuSiH_x$) to provide more surface anchoring sites (and hence better adhesion). In addition, $SiH_4$ may convert metal atoms (M) to metal silicide (in some cases $MSiH_x$), if absorbed metal precursor is not first subjected to a pinning treatment. The synergistic effect of forming both a metal-containing compound and $CuSiH_x$ provides high density of labile bonding at the interface, thus further improving the adhesion strength between Cu and the barrier layer.

The disclosed capping sequence also minimizes the resistance shift of Cu (e.g., less than about 1%), since metal or a conductive metal-containing compound may be bonded to the Cu surface through covalent bonds, which prevent metal or metal silicide from diffusing into the Cu line. The presence of the metal compound layer also limits silicon's access to the Cu surface, thus minimizes the deleterious Rs shift from the formation of $CuSi_x$. It has been observed that a reversed silicon doping sequence (with the substrate first exposed to silane then the metal-containing precursor) can cause >10% Cu Rs shift, presumably due to the formation of metal silicide and its diffusion into Cu.

FIG. 2 shows two capping sequence mechanisms, one with and the other without adsorbed metallic precursor being converted to dielectric compound. In the figure "AP" refers to an adhesion promoter (or metal-containing precursor). The upper panel of the figure shows a process in which the metal precursor is not converted prior to exposure to silane. The lower panel shows a process in which the precursor is converted prior to silane exposure. In either case, note that silicon hydride moieties occupy sites on the copper surface that were not previously occupied by the metal compound.

It should be understood that the methods and structures disclosed herein are not limited to the mechanism depicted in FIG. 2. For example, while the figure shows that the metal compound linked to the copper surface via an oxygen atom, this need not be the case. Further, while the figure shows the converted metal containing precursor as containing amine groups, this need not be the case.

The disclosed synergistic capping may be carried out in PECVD tool. A multi-station tool is particularly advantageous, with at least one station being used for dosing of metal containing precursor and a different station being used for dosing of silane or other silicon-containing precursor. Alternatively, all these operations may be combined on one station with adequate purging to prevent co-reaction of different chemistries.

Figure 3:
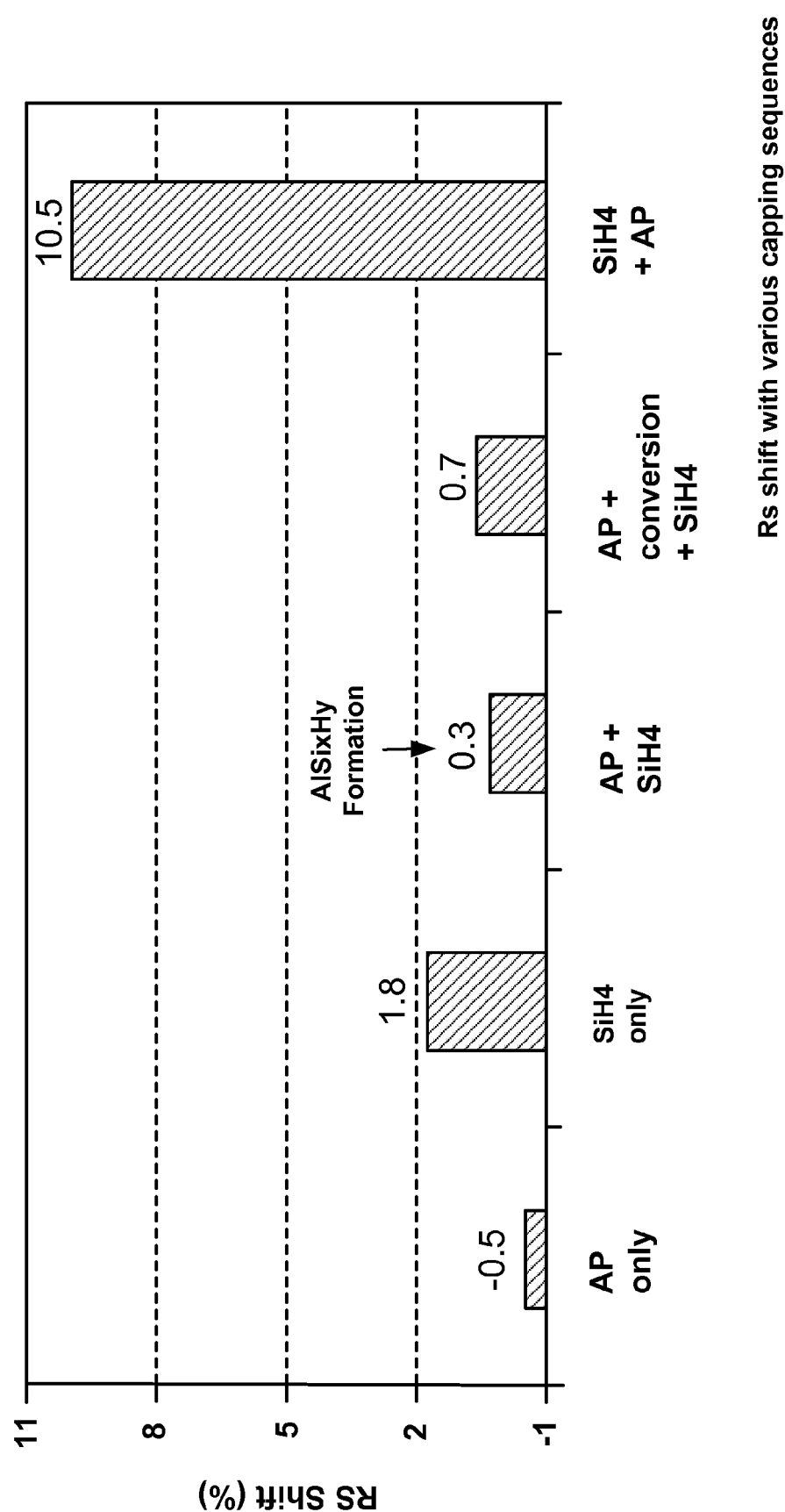
FIG. 3 illustrates results using, inter alia, a process that employed an initial exposure to metal precursor followed by exposure to silane, a process that employed silane only, and a process that employed silane first followed by the metal precursor.

In various embodiments in which the metal precursor is dosed prior to the silane treatment, the resistance of the copper lines remains low. See FIG. 3. The same is not necessarily true when the silane treatment is performed prior to the metal precursor treatment. Importantly, the two processes in FIG. 3 that employed an initial exposure to metal precursor followed by exposure to silane showed better performance than the process employing silane only or silane first followed by the metal precursor.

Table 1 shows the adhesion strength of the Cu-barrier interface for various processes. A four point bending probe was employed to make the measurements. Delamination at the copper-NDC (nitrogen doped carbide (barrier layer)) interface is undesirable. Delamination at the NDC-glue interface is desired as it indicates that the Cu-NDC interface strongly resists delamination.

TABLE 1

| | Adhesion energy | |
|---|---|---|
| | Gc (J/m2) | Comments |
| No treatment | 10 | Delam at NDC/Cu interface |
| SiH4 | 13.5 | Delam at NDC/Cu interface |
| AP + conversion | 22 | Partial delamination |
| AP + conversion + SiH4 | >33 | Delamination at NDC/Glue interface |

It should be noted that the AP+conversion and AP+conversion+silane can provide comparable results. However, in order for the non-silane process to provide results as good as those of the silane process, the conversion process is must be conducted for a significantly longer period of time. The durations required can damage the device by, e.g., increasing the dielectric constant of the dielectric.

Damascene Structure with Exposed Copper Lines

Copper conductive routes can be inlaid in trenches and vias by a number of techniques, including PVD, electroplating, electroless deposition, CVD, etc. The trenches and vias are formed in a layer of inter-metal dielectric, which may be silicon dioxide but is more typically a low-k dielectric material. Typically, materials with a k value of less than about 3.5, preferably less than about 3.0 and often as lower than about 2.8 are employed as inter layer dielectrics. These materials include but are not limited to fluorine or carbon doped silicon dioxide, organic-containing low-k materials and porous doped silicon dioxide based materials, and other materials known to those of skill in the art. Such materials can be deposited, for example, by PECVD or by spin-on methods.

In some embodiments, ULK dielectrics with low dielectric constant (e.g., dielectrics having k less than about 2.8 and frequently less than about 2.4) but with relatively poor mechanical properties are used in order to maximize electrical performance of the device. When mechanically weak, porous and organic dielectrics are used, special care is often taken to reduce dielectric damage during processing steps. In some embodiments, the use of direct plasma may be entirely avoided in capping layer formation, in order to protect exposed ULK dielectric.

As mentioned, the disclosed embodiments are particularly useful when working with interconnects for devices at the 45 nm technology node, or at the 22 nm technology node and at technology nodes beyond these.

Precleaning the Exposed Copper Surfaces

Generally, the substrate is optionally pre-cleaned in an operation 203 to remove contaminants from its surface. For example, the substrate may be pre-cleaned by exposing it to a reducing gas in a plasma (e.g., a gas selected from the group consisting of $H_2$, $N_2$, $NH_3$ and mixtures thereof in a plasma discharge) in order to remove some or all of the copper oxide from copper surface. In some embodiments pre-cleaning with $H_2$ plasma has provided devices with particularly improved characteristics. The process gas during pre-clean can also include a carrier gas, such He, Ar, etc. In one example, pre-clean is performed in a PECVD chamber at a temperature of about 200-400° C., pressure of about 1.5-4 Torr and an $H_2$ flow rate of about 4,000-10,000 sccm. The plasma, which may contain a high frequency (HF) and a low frequency (LF) component is ignited and is sustained at a total power of 200-1000 W per one 300 mm wafer. In some embodiments, it is preferable to use HF power at 0.1-1.5 $W/cm^2$ and LF power at about 0-0.8 $W/cm^2$ during the pre-clean operation. In another example, $NH_3$ is used instead of $H_2$ as a reducing gas, and is flowed into the process chamber at a flow rate ranging from about 6,000 to 8,000 sccm. An $N_2$ carrier gas is flowed into the chamber at a flow rate of about 2,000-4,000 sccm. The pre-cleaning treatment can last several seconds, e.g., between about 6-20 seconds.

In some embodiments, the pre-clean is performed such as not to completely remove copper oxide, but so as to leave about a monolayer of Cu—O bonds on copper surface. This small amount of oxide may useful for subsequent formation of M2-O bonds. Preferably, no more than 10 Å of Cu—O layer should remain on the surface in those embodiments. The controlled copper oxide removal can be achieved by controlling plasma conditions, as well as duration of the pre-clean.

In some embodiments, it is preferable to perform pre-clean using more mild methods than direct plasma exposure. These milder methods are particularly advantageous when copper lines are embedded in delicate ULK dielectrics that can be easily damaged by direct plasma exposure.

In some embodiments, complete or partial removal of copper oxide is performed by using a remote plasma comprising a gas selected from a group consisting of $H_2$, $N_2$, $NH_3$ and mixtures thereof. In this implementation, one or more of these gases (e.g., a mixture of $H_2$ and $N_2$ or a mixture of $NH_3$ and $N_2$) are used to form a plasma in a chamber that is physically separated from the chamber holding the wafer substrate. The formed plasma is then directed through a delivery line to an ion filter, which depletes the plasma of ions, while leaving the radicals. The resulting radical-rich process gas is delivered through an inlet (e.g., a showerhead) to the chamber housing the substrate. The radical-rich process gas (which in some embodiments contains little or substantially no ionic species) contacts the substrate surface and removes copper oxide, either partially or completely as desired. Because high energy ions contained in direct plasma have been implicated in dielectric damage, the use of ion-poor remote plasma provides a mild and effective way of conducting a pre-clean. Suitable examples remote plasma systems are found in the Gamma™ line of products provided by Novellus Systems of San Jose, Calif.

In other embodiments, complete or partial removal of copper oxide is performed by using a ultraviolet (UV) radiation treatment in a presence of a reducing gas, such as a gas selected from a group consisting of $H_2$, $N_2$, $NH_3$ and mixtures thereof. In this implementation, one or more of these gases (e.g., a mixture of $H_2$ and $N_2$ or a mixture of $NH_3$ and $N_2$) contact the substrate, while the substrate is irradiated with UV light. For example, an apparatus and process conditions such as described in commonly owned Provisional Patent Application Ser. No. 61/260,789 filed on Nov. 12, 2009, titled "UV and Reducing Treatment for K Recovery and surface Clean in Semiconductor Processing" by B. Varadarajan et al., which is herein incorporated by reference in its entirety for the purpose of providing details of an apparatus and methods of a UV treatment that are suitable for use in embodiments described herein. Described UV treatment can be used for controllable removal of copper oxide, where the thickness of removed oxide can be controlled by duration of UV exposure, process gas composition, substrate temperature, and other conditions.

In some embodiments pre-clean is accomplished by thermal treatment in a plasma-free environment. For example, the wafer may be heated to a temperature of at least about 200° C. for about 15 to 60 seconds in an atmosphere comprising $H_2$, $N_2$, $NH_3$, $N_2$ or mixtures thereof. Such thermal treatment may be used for partial copper oxide removal, and is particularly advantageous for treating substrates containing delicate ULK dielectrics.

In some embodiments, instead of controllably removing copper oxide to a desired thickness, it may be more efficient to completely remove copper oxide from copper surface and then controllably grow a desired amount of Cu—O bonds on copper surface (e.g., 10 Å or less). The complete removal can be performed by direct plasma treatment, remote plasma treatment, thermal treatment or UV treatment in a reducing environment, as described above, while conditions are adjusted for removal of the entire oxide layer. The growth of controlled amount of Cu—O bonds can then be implemented by exposing oxygen-free copper surface to a rigorously controlled dose of an oxygen-containing gas, such as $O_2$, $H_2O$, $CO_2$, $N_2O$ or mixtures thereof in a controlled conditions such as temperature, pressure, time, etc. Such growth may be accomplished with or without the assistance of plasma.

Forming a Metal or Metal Compound Layer on the Exposed Copper Surfaces

Bonding metallic atoms (in bound or unbound form) can be added on to the copper interconnect structure by contacting the substrate having an exposed copper surface (in some embodiments having a controlled amount of Cu—O bonds) with one or more precursors containing desired metallic elements. In preferred embodiments the deposition is performed in an absence of plasma in a chemical vapor deposition (CVD) apparatus. The following are some examplary precursors that can be used.

Aluminum-containing layers can be deposited by contacting the substrate with trialkylaluminum precursors (e.g., trimethylaluminum (TMA), triethylaluminum (TEA), and tri-isobutylaluminum (TIBA). Hydride-containing organometallic precursors, such as dimethylaluminumhydride (DMAH) can also be used.

Calcium-containing layers can be formed by contacting the substrate with organometallic calcium-containing precursors, such as calcium bis(2,2,6,6-tetramethyl-3,5-heptanedionate) ($Ca(TMHD)_2$), or other appropriate precursors.

Magnesium-containing layers can be formed by contacting the substrate with organometallic magnesium-containing precursors, such as—bis(cyclopentadienyl)magnesium, bis(ethylcyclopentadienyl)magnesium, bis(pentamethylcyclopentadienyl)magnesium, bis(n-propylcyclopentadienyl)magnesium, or other appropriate precursors.

Titanium-containing layers can be formed by contacting the substrate with organometallic titanium-containing precursors, such as bis(2,4-dimethylpentadienyl)titanium, (methylcyclopentadienyl)Ti(NMe$_2$)$_3$; (ethylcyclopentadienyl)Ti (NMe$_2$)$_3$; (propylcyclopentadienyl)Ti(NMe$_2$)$_3$; (methylcyclopentadienyl)Ti(NEt$_2$)$_3$; (ethylcyclopentadienyl)Ti(NEt$_2$)$_3$; (propylcyclopentadienyl)Ti(NEt$_2$)$_3$; (methylcyclopentadienyl)Ti(NMeEt)$_3$; (ethylcyclopentadienyl)Ti(NMeEt)$_3$; (propylcyclopentadienyl)Ti(NMeEt)$_3$, (Trimethyl)pentamethylcyclopentadienyltitanium, or other appropriate precursors.

In some embodiments, the thickness of the precursor layer is carefully controlled by forming a monolayer or a saturated layer as dictated by the thermodynamics of adsorption. For example, in some embodiments the precursor layer thickness is no more than the thickness of the precursor that can be adsorbed by the substrate. Thus, in some embodiments the process is adsorption-controlled, and deposition of uncontrollably large amounts of material is avoided.

In some embodiments, the control over thickness is achieved by controlling the thickness of copper oxide on the copper surface. In this case, the thickness of the adhesion layer will be limited by the reaction between the metal-containing precursor and available copper oxide. Thus, if a controlled small amount of Cu—O bonds is allowed to stay on the surface, the thickness of the M2-O—containing layer may be limited by the amount of Cu—O bonds.

In other embodiments, the thickness of the precursor layer can be controlled by controlling precursor flow rates, substrate exposure times, substrate temperature, or other parameters of deposition process.

In certain embodiments, the metal precursor layer (which may originally contain unbound metal) is completely converted to a stable oxide, nitride, amine, or carbide form on both copper metal lines and surrounding IMD dielectric materials. However, in some embodiments, some or all of the layer remains in the form of a free metal (or precursor—at least temporarily) at least over the copper interconnect structures.

Combinations of controlling methods described above may also be used.

While the methods described herein may be practiced in many types of apparatus, in some embodiments, plasma enhanced chemical vapor deposition (PECVD) apparatus is preferred. In some embodiments, the PECVD apparatus is capable of providing high frequency (HF) and low frequency (LF) plasma generating sources. It is noted, however, that deposition of the metal-containing precursor layer is typically performed in the absence of plasma and can be conducted in any suitable CVD apparatus. Nevertheless, in some embodiments, certain pre-treatments or post-treatments may require the use of plasma, and PECVD apparatus may be used to perform portions of the sequence or the entire sequence described herein.

Advantageously, the metal-containing precursor material does not need to selectively deposit onto the metal surface, and may be deposited both onto the surface of dielectric and onto metal, although in some embodiments it selectively deposits on the copper surface. The precursor layer is deposited by contacting the partially fabricated device with a precursor (e.g., with a metal-containing reactant) under conditions that result in a deposition of a metal-containing precursor layer.

In one embodiment, the metal-containing precursor layer is deposited thermally without a plasma discharge. For example, a volatile precursor, such as a volatile hydride, halide, carbonyl, or an organometallic compound can react (e.g., decompose) at high temperature to deposit a layer of metal-containing material on a substrate surface. In some embodiments, the precursor reacts with surface oxygen both on copper surface and on the dielectric to form M2-O bonds.

In other embodiments both deposition of free metal and M2-O bond formation may occur. The temperature range, the substrate exposure time, and other deposition conditions are tuned for each particular precursor to achieve desired result, as will be understood by those of skill in the art. For example, in some embodiments, the temperature range for deposition of Al-containing layer from TMA precursor on a copper surface containing an atomic layer of copper oxide, is selected such that essentially no free aluminum is deposited, while formation of Al—O bonds on copper surface readily occurs. Such reaction regime occurs at substrate temperatures of between about 80-350° C. In other embodiments the temperature regime may be adjusted such as free aluminum metal is deposited onto copper, where copper surface is preferably completely oxygen-free. This reaction regime may be implemented at substrate temperatures of at least about 400° C.

In one example, a volatile metal-containing precursor is introduced into the chamber. Organometallic compounds, metal hydrides, metal halides, and metal carbonyls may serve as suitable precursors. For example, alkyl-substituted metal derivatives and cyclopentadienyl-substituted metal derivatives may be used. The precursor reacts at high temperature to form a metal-containing precursor layer on a substrate. In general, depending on the nature of the precursor, the deposition conditions are optimized to deposit the metal-containing source layer with the desired qualities. For example, the temperature range may be optimized to favor a particular decomposition mechanism for a precursor, and thereby tuning the composition of metal-containing source layer, as desired.

As mentioned, a variety of metals can serve as bonding agent. For example Al, Ti, Ca, and/or Mg as well as their combinations may be used. Other metals meeting the criteria set forth herein, for which volatile precursors are known, may be used. Examples of precursors have been previously listed above. In some embodiments, aluminum-containing precursor is selected from the group consisting of trimethylaluminum, dimethylaluminum hydride, triethylaluminum, triisobutylaluminum, and tris(diethylamino)aluminum. Examples of precursors that can be used for depositing source layers containing titanium in some embodiments include but are not limited to tetrakis(dimethylamino)titanium (TDMAT), tetrakis(diethylamino)titanium (TDEAT), tetrakis(ethylmethylamido)titanium, and bis(diethylamino)bis(diisopropylamino)titanium.

As mentioned above, the precursor layer does not necessarily need to contain pure elemental metal, but may include compounds of metal with other elements, e.g., H, C, N, O, etc.

As mentioned, the precursor layer does not need to be selectively deposited exclusively on top of the copper line, but may be deposited both on top of the dielectric layer and on top of copper. In many embodiments, however, some degree of selectivity between copper and the dielectric is achieved, and a thicker precursor layer may be formed over the copper line. It is understood, that depending on particular precursor and deposition conditions, a wide variety of selectivities may be achieved ranging from an entirely selective deposition of the precursor layer onto copper line, to an entirely non-selective process where the precursor layer is deposited to an equal thickness on both copper and dielectric. Typically, when trialkylaluminum is used as a precursor, the deposition is non-selective due to facile formation of Al—O bonds on contact with the dielectric.

The precursor layer may be allowed to form a metal or metal compound layer. The compound may be an oxide for example. This may take place spontaneously, when for example, an organometallic precursor decomposes on the substrate surface to form a metal layer or when organometallic compound reacts with Cu—O bonds. In some embodiments, the reaction occurs immediately, while for some precursors or reaction conditions, a certain period of time is needed for the adsorbed precursor to react.

An optional modification or passivation operation may serve the following purposes. First, if free metal is present in the precursor layer, it may help control the interconnect resistance, by converting the metal to an immobile form, e.g., to a form containing M2-O, M2-C, M2-N bonds or combinations thereof. Preferably, the passivated layer contains materials which cannot easily diffuse from the passivated material into copper line. For example, free aluminum may be converted to aluminum oxide, nitride, etc. While free aluminum is capable of diffusing into copper line, when converted to nitrides and oxides, these materials are trapped within the passivated layer, and are not capable of entering the copper line and increasing its resistivity. Because the metal or metal oxide layer is modified in this post-treatment step, the amount of metal introduced into copper line is limited or reduced to zero.

Post-treatment may also be beneficial in those embodiments where the metal precursor layer contains conductive materials that are deposited both over copper and dielectric. In these embodiments, passivation converts the conductive material (e.g., metal) to a material with little or no conductivity, thereby preventing shorting between adjacent copper lines. For example, a precursor layer containing free metal M2 on a layer of dielectric can be converted to a non-conductive material containing M2-O, M2-N, M2-C bonds or combinations thereof.

In some embodiments post-treatment is performed in order to remove residual organic groups (e.g., alkyl groups) from the precursor layer. For example treatment with $H_2$ may be used to remove organic groups and to form M2-H bonds. Treatment with $NH_3$, $N_2$ and mixtures thereof may be used to form M2-N bonds. These treatments are particularly desired, when the precursor layer contains little or no free metal but contains residual organic bonds.

In general a variety of post-treatments for the precursor layer are possible, which can be selected depending on the nature of the precursor layer (e.g., absence or presence of free metal, residual alkyl groups, etc.), the nature of metals used, the chemistry of ILD layer, and the nature of dielectric diffusion barrier layer.

In some embodiments, post-treatment involves direct plasma treatment. For example, the substrate having exposed precursor layer may be treated with a plasma formed in a process gas selected from the group consisting of $H_2$, $N_2$, $NH_3$ and mixtures thereof. In some embodiments, the substrate having a precursor layer is treated with $H_2$ in a plasma. Hydrogen plasma treatment can serve to remove residual organic groups from the precursor layer, and to form terminal M2-H bonds. In other examples the substrate is post-treated with a mixture of $H_2$ and $N_2$ in a plasma or with $NH_3$ in a plasma, which results in removal of organic groups and in formation of M2-N bonds. Other nitridizing agents, such as $N_2H_4$ and amines may be used in some embodiments.

As is the case with pre-treatment, it is sometimes desirable to use milder treatment methods than direct plasma treatment. For example, in some embodiments the substrate may be treated using remote plasma formed in a gas selected from the group consisting of $H_2$, $N_2$, $NH_3$ and mixtures thereof. As previously described, remote plasma is generated in a chamber that is physically separated from the chamber housing the substrate, and is depleted of ionic species, before it is delivered to the substrate, which leads to lower probability of dielectric damage. This is because radicals contained in remote plasma are typically less damaging than high-energy ions. M2-H, and M2-N bonds, as well as removal of organic groups from the layer can be achieved by remote plasma.

Further, mild post-treatment can be performed by UV irradiation in a process gas selected from the group consisting of $H_2$, $N_2$, $NH_3$ and mixtures thereof, using methods described in U.S. Provisional Application Ser. No. 61/260,789 which was previously incorporated by reference. Such UV treatment can be used to form M2-H, and M2-N bonds, as well as to remove organic substituents from the precursor layer.

In some embodiments post-treatment is accomplished by thermal treatment in a plasma-free environment. For example, the wafer may be heated to a temperature of at least about 300 to 350° C. in an atmosphere comprising $H_2$, $N_2$, $NH_3$, or mixtures thereof. Such thermal treatment is particularly advantageous for treating substrates containing delicate ULK dielectrics.

Remote plasma post-treatment, thermal post-treatment, and UV post-treatment are particularly advantageous when ULK dielectrics, particularly easily damaged porous and organic dielectrics are used in the ILD layer.

While nitridizing post-treatment is preferred in many embodiments, in some embodiments other types of post-treatment may be used. For example oxidizing post-treatment to form M2-O bonds may be implemented by contacting the substrate having exposed precursor layer to an oxygen-containing gas (such as $O_2$, $CO_2$, $N_2O$, etc.) in a plasma. In other embodiments, M2-C bonds are formed in the post-treatment step, for example, by treating the precursor layer with a hydrocarbon in a plasma. M2-S, M2-Se, M2-Te, and M2-P can be formed in post-treatment step by exposing the substrate to a reactant containing a required element, e.g., $H_2S$, $H_2Se$, $H_2Te$, $PH_3$, respectively, with or without a plasma. Both direct plasma and remote plasma can be used for these types of post-treatments.

In certain embodiments, the metal deposition portion of the process herein provides an extremely thin adhesion layer (usually 1-3, preferably about 1 atomic monolayer of aluminum atoms), which contains immobilized aluminum in Al—O bound form at the top of copper line. Further, in some embodiments, the layer has strong O—Al—N—Si bonding with the dielectric diffusion barrier layer. Because of the small thickness of the adhesion layer and because of immobility of bound aluminum interconnects with such adhesion layers do not exhibit large increases in resistance (e.g., as compared with interconnects with large amounts of diffusing dopants or thick caps).

Silane Treatment

Regardless of whether the metal-containing precursor is converted or not, the substrate is treated with silane or other silicon-containing precursor. In some embodiments, reactants other than silicon-containing precursor may be employed. In U.S. patent application Ser. No. 11/726,363, previously incorporated by reference, these compounds are sometimes generally referred to as "PSAB forming reactants." PSAB is Protective Self-Aligned Buffer (or Barrier). Other than silicon-containing precursors, precursors that may be used herein include germanium-containing compounds, boron-containing compounds, and the like.

Examples of silicon containing reactant include $SiH_4$, $Si_2H_6$, $Si_3H_8$, substituted silanes (e.g., $RSiH_3$, $R_2SiH_2$, $R_3SiH$, wherein R is an alkyl, alkenyl or alkynyl, which may be further substituted with heteroatoms), etc. Metal silicides formed by exposure to such compounds provide excellent adhesion to diffusion barrier layers, as discussed above.

Generally, the silicon-containing reactant can be delivered at a substrate temperature ranging from about 20° C. to 500° C., and at a pressure ranging from about 10 mTorr to about 100 Torr. In a specific embodiment, silane is delivered in the temperature range of about 200-400° C., for example. The flow rates of reactants in the process can range from about 0.001 sccm to about 10000 sccm (per process chamber housing four 300 mm wafers), and reactant contact times can range from about 0.5 to about 50000 seconds, e.g. from about 0.5 to about 5000 seconds.

In some embodiments, the silicon dosing process may include a plasma treatment or a plasma-enhanced reaction. Therefore, in some embodiments it is preferable to use PECVD tools, such as SEQUEL™ and VECTOR™ PECVD tools available from Novellus Systems, Inc. (San Jose, Calif.). Frequently, the tool contains multiple stations in a single pressure controlled chamber. In some embodiments, the method is implemented in a cluster tool having multiple integrated single-wafer chambers such as the VECTOR Excel™. Further, in some embodiments, a dual frequency PECVD apparatus that has high frequency (HF) and low frequency (LF) radio frequency (RF) plasma sources, is used. Low frequency RF power refers to RF power having a frequency between 100 kHz and 2 MHz. A typical frequency range for LF plasma source is between about 100 kHz to 500 kHz, e.g., 400 kHz frequency may be used. High frequency power refers to RF power with a frequency greater than 2 MHz. Typically HF RF frequency lies in the range of between about 2 MHz-30 MHz. A commonly used HF RF values include 13.56 MHz and 27 MHz. In some embodiments LF power ranging from about 0 W/cm$^2$ to 1.0 W/cm$^2$, and HF power ranging from 0.1-1.5 W/cm$^2$ can be used in plasma assisted operations, such as during pre-clean, pinning and H$_2$ post-treatment. In some embodiments a single frequency process is used in plasma-assisted operations.

In a particular example, the silicide (or other silicon containing material) component of the adhesion layer is formed by flowing SiH$_4$ into a process chamber at a flow rate of about 100-1000 sccm. NH$_3$ at a flow rate of about 4000-10000 sccm or H$_2$ at a flow rate of about 4000-10000 sccm can be optionally flowed into the process chamber concurrently with silane. The SiH$_4$ treatment lasts for about 1-20 seconds at a temperature ranging from about 200-400° C. and pressure ranging from about 1.5-4 Torr. In some embodiments, the temperature is kept below 300° C. in order to limit diffusion of nonconductive species into the metal line.

The thickness of the adhesion layers formed after silicon incorporation can range from about 10 Å to 10,000 Å. In specific embodiments, the layers have a thickness in the range of about 10-100 Å, particularly in the range of about 10-60 Å.

Forming the Barrier Layer on the Adhesion Layer

Upon formation of the metal-silicon combination adhesion layer, a layer of doped or undoped silicon carbide is deposited. The layer of silicon carbide serves as an etch stop and/or a dielectric diffusion barrier layer and is typically deposited to a thickness of about 100-500 Å. The layer of silicon carbide can be deposited by CVD (preferably by PECVD), for example, by exposing the substrate to silicon-containing and carbon-containing precursors in a plasma discharge. For example, silane, alkylsilanes, and hydrocarbons may be used as precursors. When doped silicon carbide is deposited, the dopant-containing precursor is additionally introduced into the process chamber. For example, CO$_2$, O$_2$ or N$_2$O may be added during deposition of oxygen-containing silicon carbide, B$_2$H$_6$ may be added to deposit boron-doped silicon carbide, NH$_3$ and N$_2$ may be added to deposit nitrogen-doped silicon carbide, etc. In other embodiments, doped or undoped silicon nitride or silicon carbonitride is deposited on top of the metal-containing adhesion layer to serve as an etch stop or diffusion barrier layer. Deposition of silicon nitride can be performed by PECVD using a silicon-containing precursor (e.g., silane) and a nitrogen-containing precursor (e.g., ammonia). Silicon carbonitride can be deposited by PECVD using a precursor or precursors containing carbon, silicon, and nitrogen, e.g., using a mixture of organosilane and ammonia.

After the diffusion barrier has been deposited, an interconnect may be formed using conventional Damascene processing.

It is noted that in some cases, deposition of a dielectric diffusion barrier or an etch stop layer is optional, because the adhesion layer (formed with or without post-treatment) may have suitable properties to serve as a diffusion barrier or an etch stop. For example, an adhesion layer containing certain metal oxides or nitrides may serve as a diffusion barrier layer, eliminating the need for deposition of a separate silicon carbide layer.

Apparatus

In general, formation of adhesion layers can be performed in any type of apparatus which allows for introduction of volatile precursors, and is configured to provide control over reaction conditions, e.g., chamber temperature, precursor flow rates, exposure times, etc. In some embodiments, pre-clean, the precursor treatment, capping layer post-treatment (modification), silane treatment, and dielectric diffusion barrier deposition are all performed without exposing the substrate to ambient environment, in order to prevent inadvertent oxidation and contamination of the substrate. In one embodiment, these operations are performed sequentially in one module without breaking the vacuum. In some embodiments, the operations are performed in one CVD (preferably PECVD) apparatus having multiple stations within one chamber, or having multiple chambers. VECTOR™ PECVD apparatus available from Novellus Systems, Inc of San Jose, Calif. is an example of a suitable apparatus.

An exemplary apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing the metal precursor layer and etch stop layer deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD system may be used. In even more preferred embodiments the PECVD system includes a LF RF power source.

In one of the embodiments a multi-station apparatus may be used for forming a capping layer and a diffusion barrier. The multi-station reactor allows one to run different processes concurrently in one chamber environment, thereby increasing the efficiency of wafer processing.

In one of the embodiments, individual stations can operate under distinct process conditions and may be substantially isolated from each other. For example one station may operate under one temperature regime, while another may operate under a different temperature regime.

In one embodiment, pre-cleaning operation, deposition of the metal precursor layer, precursor conversion, and silane treatment are performed in one preferred temperature regime and are carried out in one station of the multi-station apparatus. The deposition of a dielectric diffusion barrier may require a different temperature regime in some embodiments, and may be carried out in a different station or stations. In some embodiments, the entire capping process including pre-treatment, formation of the precursor layer, and silane-treatment is performed in one station of a single station or a multi-station apparatus. In some embodiments, deposition of a dielectric diffusion barrier layer may be also performed at the same station as the capping operation. In other embodiments dielectric diffusion barrier may be deposited in a different station or even in a different apparatus altogether.

The process conditions and the process flow itself can be controlled by a controller unit which comprises program instructions for monitoring, maintaining and/or adjusting certain process variables, such as HF and LF power, gas flow rates and times, temperature, pressure and the like. For example, instructions specifying flow rates of metal precursor and ammonia for precursor layer deposition and post-treatment may be included. The instructions may specify all of the parameters to perform operations, according to methods described above. For example, instructions may include parameters for pre-clean, precursor layer deposition, formation of the post-treated adhesion layer, and for dielectric diffusion barrier deposition. The controller may comprise different or identical instructions for different apparatus stations, thus allowing the apparatus stations to operate either independently or synchronously.

The apparatus/process described hereinabove may be used in conjunction with lithographic patterning tools or processes, for example, for the fabrication or manufacture of semiconductor devices, displays, LEDs, photovoltaic panels and the like. In one example the Damascene trenches and vias are formed using such lithographic patterning tools and processes. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

One or more of the above-disclosed embodiments may provide one or more of the following improvements. There is little or no increase of Cu resistance due to dopant incorporation or diffusion into Cu bulk film. Film adhesion and cohesive strength between the dielectric copper barrier and Cu is significantly improved. Cu electromigration (EM) resistance is improved because film adhesion and cohesive strength are increased. Some of the disclosed embodiments can use an existing PDL (pulsed deposition layer) tools or modified PDL components for TMA (trimethyl aluminum) treatment.

Although various details have been omitted for clarity's sake, various design alternatives may be implemented. Therefore, the present examples are to be considered as illustrative and not restrictive, and the invention is not to be limited to the details given herein.

What is claimed is:

1. A method of forming a capping layer on a current carrying metal line of a semiconductor device, the method comprising:
   (a) delivering a metal-containing precursor to a reaction chamber holding a partially fabricated semiconductor device having an exposed surface of a metal line, wherein the metal-containing precursor adheres or bonds to the exposed surface of the metal line, wherein the metal-containing precursor comprises a first metal;
   (b) delivering a silicon-containing precursor to the reaction chamber; and
   (c) forming the capping layer on the metal line by allowing at least a portion of the silicon-containing precursor to interact with the exposed surface of the metal line and/or interact with the metal-containing precursor or first metal.

2. The method of claim 1, wherein the first metal of the metal-containing precursor is different from the metal of the metal line.

3. The method of claim 1, wherein the first metal is selected from the group consisting of aluminum, titanium, magnesium, and calcium.

4. The method of claim 1, wherein operations (b) and (c) overlap in time.

5. The method of claim 1, further comprising cleaning the exposed surface of the metal line prior to performing operation (a).

6. The method of claim 1, further comprising removing an oxide from the exposed surface of the metal line prior to performing operation (a).

7. The method of claim 1, wherein operation (a) comprises a chemical vapor deposition reaction.

8. The method of claim 1, wherein operation (a) results in the first metal depositing on the exposed surface of the metal line.

9. The method of claim 1, further comprising converting at least some of the metal-containing precursor or the first metal on the exposed surface of the metal line to a dielectric material.

10. The method of claim 9, wherein the dielectric material comprises the first metal and an element selected from the group consisting of oxygen, carbon, and nitrogen.

11. The method of claim 9, wherein converting at least some of the layer of the first metal to a dielectric material is performed prior to operation (c).

12. The method of claim 1, wherein the metal-containing precursor is not converted to a dielectric material prior to performing operation (c).

13. The method of claim 1, wherein the silicon containing precursor attaches to the exposed surface of the metal line in interstitial regions where the metal-containing precursor did not adhere or bond to the metal line.

14. The method of claim 1 wherein the metal line comprises copper.

15. The method of claim 1, wherein the metal line comprises an interconnect in the semiconductor device.

16. The method of claim 1, wherein the metal-containing precursor is selected from the group consisting of organoaluminum compounds, organomagnesium compounds, organotitanium compounds, and organocalcium compounds.

17. The method of claim 1, wherein the silicon-containing precursor is selected from the group consisting of silanes and substituted silanes.

18. The method of claim 1, wherein operation (c) is performed in the presence of a plasma.

19. The method of claim 1, further comprising forming a diffusion barrier over the capping layer.

20. The method of claim 19, wherein the diffusion barrier comprises a silicon carbide.

21. The method of claim 1 further comprising:
 (i) prior to (a), applying photoresist to a workpiece;
 (ii) exposing the photoresist to light;
 (iii) patterning the resist and transferring a pattern to the workpiece, wherein the pattern defines locations of the metal lines; and
 (iv) selectively removing the photoresist from the work piece.

* * * * *